US012720921B2

(12) United States Patent
Kim et al.

(10) Patent No.: US 12,720,921 B2
(45) Date of Patent: Aug. 25, 2026

(54) LIGHT EMITTING DEVICE AND DISPLAY APPARATUS INCLUDING THE SAME

(71) Applicant: LG Display Co., Ltd., Seoul (KR)

(72) Inventors: Il-Soo Kim, Goyang-si (KR); Myungsoo Han, Goyang-si (KR); Hyowon Kwon, Suwon-si (KR)

(73) Assignee: LG Display Co., Ltd., Seoul (KR)

(*) Notice: Subject to any disclaimer, the term of this patent is extended or adjusted under 35 U.S.C. 154(b) by 428 days.

(21) Appl. No.: 18/421,868

(22) Filed: Jan. 24, 2024

(65) Prior Publication Data

US 2024/0250216 A1 Jul. 25, 2024

(30) Foreign Application Priority Data

Jan. 25, 2023 (KR) ........................ 10-2023-0009453

(51) Int. Cl.

| | |
|---|---|
| ***H10W 90/00*** | (2026.01) |
| ***H10D 86/40*** | (2025.01) |
| ***H10D 86/60*** | (2025.01) |
| ***H10H 20/831*** | (2025.01) |
| ***H10H 20/855*** | (2025.01) |

(52) U.S. Cl.

CPC ...... *H10H 20/8314* (2025.01); *H10D 86/441* (2025.01); *H10D 86/60* (2025.01); *H10H 20/855* (2025.01); *H10W 90/00* (2026.01)

(58) Field of Classification Search

CPC ............. H10H 20/8314; H10H 20/855; H10H 20/819; H10H 20/8312; H10H 20/84; H10H 20/857; H10H 20/831; H10H 20/812; H10H 29/142; H10D 86/441; H10D 86/60; H10D 86/40; H10W 90/00

USPC ........................................................... 257/99

See application file for complete search history.

(56) References Cited

U.S. PATENT DOCUMENTS

2011/0186892 A1* 8/2011 Jeong .................. H10H 20/018 257/E33.074
2014/0159095 A1* 6/2014 Jeong ..................... H10H 20/82 257/98

(Continued)

FOREIGN PATENT DOCUMENTS

KR 101888857 B1 9/2018

*Primary Examiner* — Sheikh Maruf
(74) *Attorney, Agent, or Firm* — Seed Intellectual Property Law Group LLP

(57) ABSTRACT

Disclosed is a display apparatus including a light-emitting device having a light-emitting structure including a first semiconductor layer, an active layer and a second semiconductor layer, a passivation layer covering surfaces of the light-emitting structure. The light-emitting device includes at least one first electrode coupled to the first semiconductor layer and at least one second electrode coupled to the second semiconductor layer. A first electrode includes a first upper portion extending through the passivation layer to contact the first semiconductor layer, a first side portion, and a first lower portion on a portion of a side surface and a lower surface of the light-emitting structure, respectively. A second electrode includes a second upper portion extending through the passivation layer to contact the second semiconductor layer, a second side portion and a second lower portion on a portion of the side surface and the lower surface of the light-emitting structure, respectively.

19 Claims, 12 Drawing Sheets

(56) References Cited

U.S. PATENT DOCUMENTS

2015/0187991 A1* 7/2015 McGroddy ........ H10H 20/8162
257/13
2018/0012876 A1* 1/2018 Kim ...................... H10W 90/00
2018/0175106 A1* 6/2018 Kim ..................... H10H 20/819
2019/0081025 A1* 3/2019 Chang ................... H10W 90/00
2019/0148601 A1* 5/2019 Park ................... H10H 20/8312
257/88
2019/0181300 A1* 6/2019 Park ................... H10H 20/8312
2021/0013190 A1* 1/2021 Kim ...................... H10W 90/00
2022/0209066 A1* 6/2022 Tan ...................... H10H 20/817
2022/0254961 A1* 8/2022 Chang ................ H10H 20/8314
2022/0384516 A1* 12/2022 Tan ...................... H10H 29/142
2023/0025769 A1* 1/2023 Kim ...................... H10W 90/00

* cited by examiner 118
125n
125
125p
143'
148
140'
142
147
145
141
146
3B
3B
105'
110'
115'
120'

LIGHT EMITTING DEVICE AND DISPLAY APPARATUS INCLUDING THE SAME

CROSS-REFERENCE TO RELATED APPLICATION

This application claims priority from Korean Patent Application No. 10-2023-0009453 filed on Jan. 25, 2023, in the Korean Intellectual Property Office, and all the benefits accruing therefrom under 35 U.S.C. 119, the contents of which in its entirety are herein incorporated by reference.

BACKGROUND

Technical Field

The present disclosure relates to a light-emitting device and a display apparatus including the same. More specifically, the present disclosure relates to a light-emitting device which may be normally electrically connected to an array substrate even when the light-emitting device is turned upside down during a transfer process, and a display apparatus including the same.

Description of Related Art

A liquid crystal display apparatus and an organic light-emitting display apparatus are used as a flat display apparatus.

The organic light-emitting display apparatus have advantages such as improved luminous efficiency, fast response speed, and wide viewing angle compared to the liquid crystal display apparatus. However, because the organic light-emitting display apparatus contains an organic material, the organic light-emitting display apparatus is vulnerable to moisture and oxygen, which may cause defective pixels.

Recently, an inorganic light-emitting display apparatus using an inorganic light-emitting layer that is resistant to moisture and oxygen has been proposed. The inorganic light-emitting display apparatus in which an inorganic light-emitting diode smaller than 100 micrometers (μm) is disposed in each pixel to display an image is referred to as a micro light-emitting diode display apparatus.

In order to manufacture the inorganic light-emitting display apparatus or the micro light-emitting diode display apparatus, a process of transferring an inorganic light-emitting diode onto an array substrate including a thin-film transistor, etc., is required.

BRIEF SUMMARY

In a process of transferring the light-emitting device such as an inorganic light-emitting diode, there may be cases where the light-emitting device such as the inorganic light-emitting diode is mounted in a turned upside down state, causing defective pixels in the display apparatus. It takes a lot of time to discover and repair the defective pixels, and thus a manufacturing cost of the display apparatus increases.

Accordingly, the inventors of the present disclosure have invented a light-emitting device that may be normally electrically connected to the array substrate even when the device is turned upside down.

A technical purpose according to one embodiment of the present disclosure is to provide a light-emitting device which may be normally electrically connected to an array substrate even when the light-emitting device is turned upside down during a transfer process, and a display apparatus including the same.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A light-emitting device according to some embodiments of the present disclosure includes a light-emitting structure including a first semiconductor layer, an active layer and a second semiconductor layer; a passivation layer covering surfaces of the light-emitting structure; at least one first electrode connected to the first semiconductor layer; and at least one second electrode connected to the second semiconductor layer. In this regard, the at least one first electrode includes: a first upper portion extending through the passivation layer so as to contact the first semiconductor layer; a first side portion disposed on a portion of a side surface of the light-emitting structure; and a first lower portion disposed on a portion of a lower surface of the light-emitting structure, wherein the at least one second electrode includes: a second upper portion extending through the passivation layer so as to contact the second semiconductor layer; a second side portion disposed on a portion of the side surface of the light-emitting structure; and a second lower portion disposed on a portion of the lower surface of the light-emitting structure.

A display apparatus according to some embodiments of the present disclosure includes an array substrate including a thin-film transistor, a first pad electrode connected to the thin-film transistor, and a second pad electrode spaced apart from the first pad electrode; an adhesive layer disposed on the first pad electrode and the second pad electrode; and a light-emitting device disposed on the adhesive layer. In this regard, the light-emitting device includes: a light-emitting structure including a first semiconductor layer, an active layer and a second semiconductor layer; a passivation layer covering surfaces of the light-emitting structure; at least one first electrode connected to the first semiconductor layer; and at least one second electrode connected to the second semiconductor layer, wherein the at least one first electrode includes: a first upper portion extending through the passivation layer so as to contact the first semiconductor layer; a first side portion disposed on a portion of a side surface of the light-emitting structure; and a first lower portion disposed on a portion of a lower surface of the light-emitting structure, wherein the at least one second electrode includes: a second upper portion extending through the passivation layer so as to contact the second semiconductor layer; a second side portion disposed on a portion of the side surface of the light-emitting structure; and a second lower portion disposed on a portion of the lower surface of the light-emitting structure.

According to embodiments of the present disclosure, each of the first electrode and the second electrode has the upper portion, the side portion, and the lower portion. Thus, even when the light-emitting device is turned upside down during the transfer process thereof to the array substrate of the display apparatus, the light-emitting device may be electrically connected normally to the array substrate and thus may operate normally.

Moreover, according to embodiments of the present disclosure, the light-emitting device may include the plurality of first electrodes spaced apart from each other and the plurality of second electrodes spaced apart from each other. Thus, when each of the first electrode and the second electrode includes an opaque metal, light extraction loss may be reduced. When the light-emitting device is mounted on the array substrate of the display apparatus, electrical connection thereof with the pad electrode may be guaranteed.

According to embodiments of the present disclosure, a time required to repair the defective pixel occurring when the light-emitting device is mounted on the array substrate in the turned upside down state may be reduced or removed. Thus, increase in a manufacturing cost of the display apparatus may be prevented.

Effects of the present disclosure are not limited to the effects mentioned above, and other effects not mentioned will be clearly understood by those skilled in the art from the descriptions below.

DETAILED DESCRIPTIONS

Figure 1A:
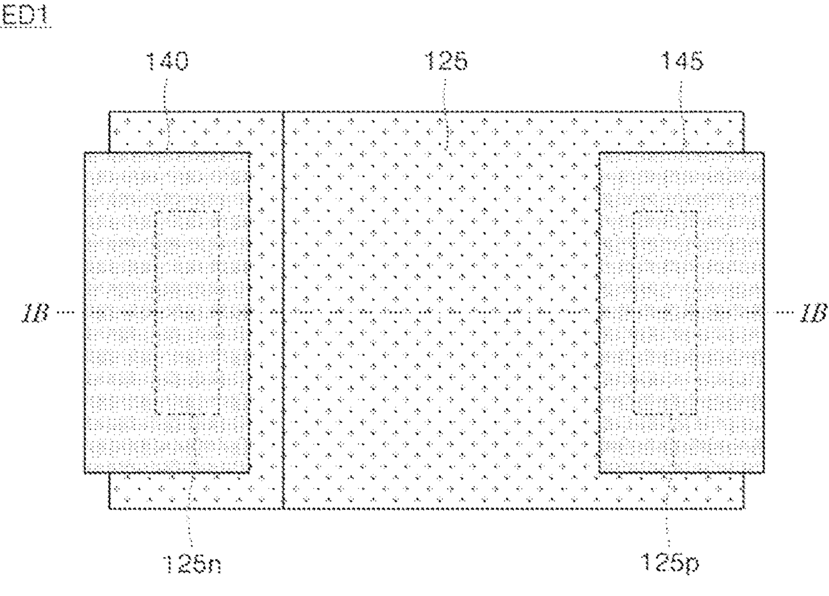
FIG. 1A shows a light-emitting device according to one embodiment of the present disclosure from a plan view.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "comprising," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element or layer may be disposed directly on the second element or layer or may be disposed indirectly on the second element or layer with a third element or layer being disposed between the first and second elements or layers.

It will be understood that when an element or layer is referred to as being "connected to," or "coupled to" another element or layer, it may be directly connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range even if there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects," and the like should not be construed such that any aspect or design as described is superior to or advantageous over other aspects or designs.

Further, the term 'or' means 'inclusive or' rather than 'exclusive or.' That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, light-emitting devices and display apparatuses according to embodiments according to the present disclosure will be described in detail with reference to the attached drawings.

FIGS. 1 to 4 show light-emitting devices according to embodiments of the present disclosure.

Figure 1B:
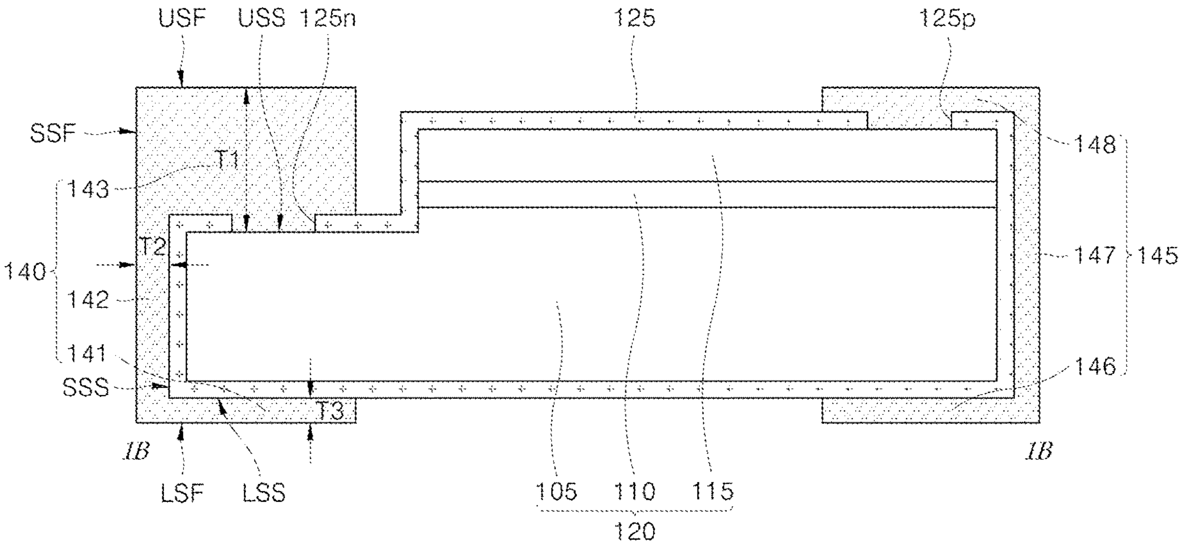
FIG. 1B shows a cross-sectional view of the light-emitting device shown in FIG. 1A.

FIG. 1A shows a light-emitting device ED1 according to one embodiment of the present disclosure. FIG. 1B is a cross-sectional view along line "1B-1B" in FIG. 1A.

Referring to FIGS. 1A and 1B, the light-emitting device ED1 according to an embodiment of the present disclosure may include a light-emitting structure 120, a passivation layer 125, a first electrode 140, and a second electrode 145. The maximum horizontal width of the light-emitting device ED1 may be, for example, 100 μm or smaller. The light-emitting device ED1 may be referred to as a micro light-emitting diode (LED).

The light-emitting structure 120 may include a first semiconductor layer 105, an active layer 110, and a second semiconductor layer 115. The active layer 110 and the second semiconductor layer 115 may be partially disposed on the first semiconductor layer 105. A portion of the active layer 110 and a portion of the second semiconductor layer 115 may be removed, so that a portion of the first semiconductor layer 105 may protrude outwardly beyond the active layer 110 and the second semiconductor layer 115.

The light-emitting structure 120 may be surrounded with the passivation layer 125. The passivation layer 125 may cover surfaces of the light-emitting structure 120. The passivation layer 125 may cover an upper surface, side surfaces, and a lower surface of the light-emitting structure 120. The passivation layer 125 may include a first open area 125*n* exposing a portion of the first semiconductor layer 105 and a second open area 125*p* exposing a portion of the second semiconductor layer 115. The passivation layer 125 may be made of an inorganic insulating material such as silicon oxide, silicon nitride, silicon oxynitride, aluminum oxide, etc.

The first electrode 140 is connected to the first semiconductor layer 105 through the first open area **125*n*, and the second electrode 145 is connected to the second semiconductor layer 115 through the second open area 125*p*. The first electrode 140 and the second electrode 145 are spaced apart from each other. When the first semiconductor layer 105 is an n-type semiconductor layer and the second semiconductor layer 115 is a p-type semiconductor layer, the first electrode 140 may be referred to as an n-side electrode and the second electrode 145** may be referred to as a p-side electrode.

The light-emitting structure 120 may be made of, for example, a group III nitride semiconductor material. However, the present disclosure is not limited thereto.

Each of the first semiconductor layer 105, the active layer 110 and the second semiconductor layer 115 of the light-emitting structure 120 may be made of a group III nitride semiconductor material, that is, $In_xAl_yGa_{(1-x-y)}N$ ($0 \leq x<1$, $0 \leq y<1$).

The first semiconductor layer 105 is a layer for supplying electrons to the active layer 110, and may be made of a group III nitride semiconductor material doped with n-type impurities such as silicon (Si), germanium (Ge), selenium (Se), and tellurium (Te). For example, the first semiconductor layer 105 may include n-type gallium nitride (GaN).

The active layer 110 disposed on the first semiconductor layer 105 may have a multi quantum well (MQW) structure. The active layer 110 is a layer in which electrons and holes are combined with each other to emit light. The multiple quantum well structure of the active layer 110 may include a plurality of barrier layers and a plurality of well layers. For example, each of the plurality of well layers may be made of indium gallium nitride (InGaN) and each of the plurality of barrier layers may be made of gallium nitride (GaN). A content of indium (In) in the well layer may be designed according to the wavelength of the emitted light. The multiple quantum well structure of the active layer 110 is not limited to the above-described structure.

The second semiconductor layer 115 disposed on the active layer 110 is a layer for injecting holes into the active layer 110, and may be made of a group III nitride semiconductor material doped with p-type impurities such as magnesium (Mg), zinc (Zn), and beryllium (Be). The second semiconductor layer 115 may include, for example, p-type gallium nitride (GaN).

The first electrode 140 connected to the first semiconductor layer 105 may include a first lower portion 141 which is disposed on a portion of a lower surface of the first semiconductor layer 105, a first side portion 142 disposed on a portion of a side surface of the first semiconductor layer 105, and a first upper portion 143 disposed on an upper surface of a portion of the first semiconductor layer 105 that protrudes outwardly beyond the active layer 110 and the second semiconductor layer 115.

The first upper portion 143 of the first electrode 140 may contact the first semiconductor layer 105 through the first open area **125*n* of the passivation layer 125. The first upper portion 143 of the first electrode 140 may be thicker than each of the first lower portion 141 and the first side portion 142 of the first electrode 140. That is, a thickness T1 of the first upper portion 143 of the first electrode 140 may be thicker than a thickness T3 of the first lower portion 141 of the first electrode 140. Similarly, the thickness T1 of the first upper portion 143 of the first electrode 140 may be thicker than a thickness T2 the first side portion 142 of the first electrode 140**.

In one embodiment, a thickness T1 of the first upper portion 143 of the first electrode 140 is defined by a height or length between an upper surface USF of the first upper portion 143 of the first electrode 140 and an upper surface USS of the semiconductor layer 105. A thickness T2 of the first side portion 142 of the first electrode 140 is defined by a height or length between a side surface SSF of the first side portion 142 of the first electrode 140 and a side surface SSS of the passivation layer 125. A thickness T3 of the first lower portion 141 of the first electrode 140 is defined by a height or length between a lower surface LSF of the first lower portion 141 of the first electrode 140 and a lower surface LSS of the passivation layer 125 (see FIG. 1B). In order to avoid redundancy, the thicknesses shown in FIG. 1B is not shown in FIGS. 2B, 3B, and 4B.

Since the passivation layer 125 is disposed between the first electrode 140 and the light-emitting structure 120, the first electrode 140 and the light-emitting structure 120 may be insulated from each other in an area other than the first open area **125*n* of the passivation layer 125**.

The first electrode 140 may be composed of a single layer or a plurality of layers made of at least one metal selected from nickel (Ni), gold (Au), platinum (Pt), titanium (Ti), aluminum (Al), chromium (Cr), and copper (Cu) or an alloy thereof.

The second electrode 145 connected to the second semiconductor layer 115 may include a second lower portion 146 disposed on a portion of the lower surface of the first semiconductor layer 105, a second side portion 147 disposed on a portion of a side surface of each of the first semiconductor layer 105, the active layer 110, and the second semiconductor layer 115, and a second upper portion 148 disposed on a portion of the upper surface of the second semiconductor layer 115.

The second upper portion 148 of the second electrode 145 may contact the second semiconductor layer 115 through the second open area **125*p* of the passivation layer 125**.

Since the passivation layer 125 is disposed between the second electrode 145 and the light-emitting structure 120, the second electrode 145 and the light-emitting structure 120 may be insulated from each other in an area other than the second open area **125*p* of the passivation layer 125**.

The second electrode 145 may be composed of a single layer or a plurality of layers made of at least one metal selected from nickel (Ni), gold (Au), platinum (Pt), titanium (Ti), aluminum (Al), chromium (Cr), and copper (Cu) or an alloy thereof.

An ohmic contact layer may be further disposed between the second semiconductor layer 115 and the second electrode 145. The ohmic contact layer may include a transparent conductive oxide such as ITO (Indium Tin Oxide), IGZO (Indium Gallium Zinc Oxide), and IZO (Indium Zinc Oxide).

In this embodiment, each of the first electrode 140 and the second electrode 145 has the upper portion, the side portion, and the lower portion. Thus, even when the light-emitting device ED1 is turned upside down during the process of being transferred to an array substrate of a display apparatus, the light-emitting device ED1 may be electrically connected normally to the array substrate.

Figure 2A:
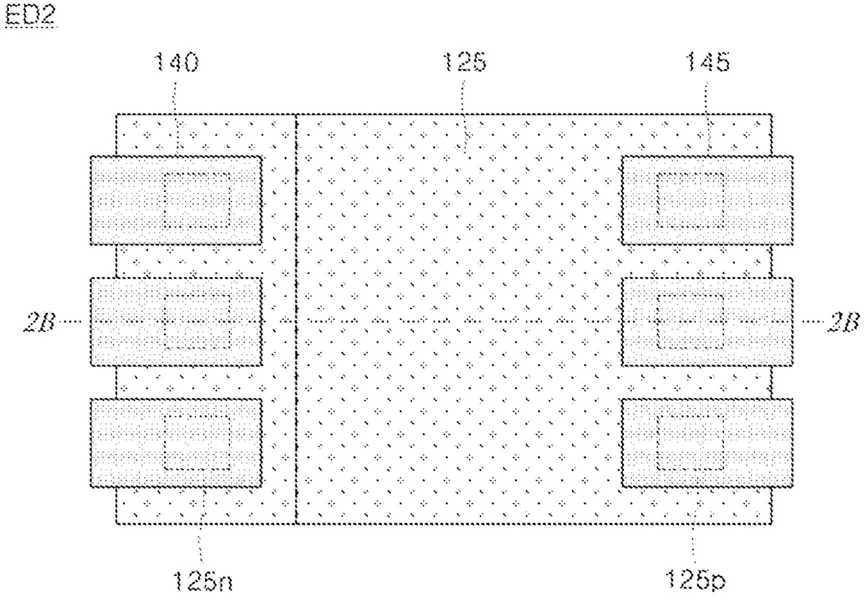
FIG. 2A shows a light-emitting device according to another embodiment of the present disclosure.
Figure 2B:
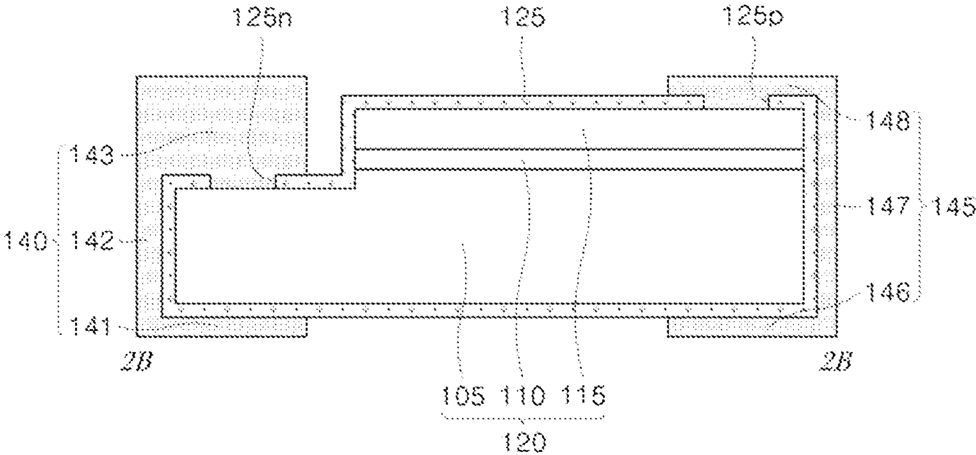
FIG. 2B shows a cross-sectional view of the light-emitting device shown in FIG. 2A.

FIG. 2A shows a light-emitting device ED2 according to one embodiment of the present disclosure. FIG. 2B is a cross-sectional view along line "2B-2B" in FIG. 2A.

Referring to FIGS. 2A and 2B, the light-emitting device ED2 according to an embodiment of the present disclosure may include a light-emitting structure 120, a passivation layer 125, a plurality of first electrodes 140 spaced apart from each other, and a plurality of second electrodes 145 spaced apart from each other.

The maximum horizontal width of the light-emitting device ED2 may be, for example, 100 μm or smaller. The light-emitting device ED2 may be referred to as a micro light-emitting diode LED.

The light-emitting structure 120 may include the first semiconductor layer 105, the active layer 110, and the second semiconductor layer 115. The active layer 110 and the second semiconductor layer 115 may be partially disposed on the first semiconductor layer 105. A portion of the active layer 110 and a portion of the second semiconductor layer 115 are removed so that a portion of the first semiconductor layer 105 may protrude outwardly beyond the active layer 110 and the second semiconductor layer 115.

The light-emitting structure 120 may be surrounded with the passivation layer 125. The passivation layer 125 may cover the surfaces of the light-emitting structure 120. The passivation layer 125 may cover the upper surface, the side surfaces, and the lower surface of the light-emitting structure 120. The passivation layer 125 may be include a plurality of first open areas 125*n* respectively exposing portions of the first semiconductor layer 105 and a plurality of second open areas 125*p* respectively exposing portions of the second semiconductor layer 115.

FIGS. 2A and 2B show three first electrodes 140 and three second electrodes 145. However, this is an example. The number of the first electrodes 140 and the number of the second electrodes 145 are not limited to what are shown.

Each of the first electrodes 140 is connected to the first semiconductor layer 105 through the first open area 125*n*. Each of the second electrodes 145 is connected to the second semiconductor layer 115 through the second open area 125*p*. The first electrode 140 and the second electrode 145 are spaced apart from each other. When the first semiconductor layer 105 is an n-type semiconductor layer and the second semiconductor layer 115 is a p-type semiconductor layer, the first electrode 140 may be referred to as an n-side electrode and the second electrode 145 may be referred to as a p-side electrode.

Each of the first electrodes 140 may include the first lower portion 141 disposed on a portion of the lower surface of the first semiconductor layer 105, the first side portion 142 disposed on a portion of the side surface of the first semiconductor layer 105, and the first upper portion 143 disposed on a portion of the upper surface of the first semiconductor layer 105 that protrudes outwardly beyond the active layer 110 and the second semiconductor layer 115.

The first upper portion 143 of the first electrode 140 may contact the first semiconductor layer 105 through the first open area 125*n* of the passivation layer 125. The first upper portion 143 of the first electrode 140 may be thicker than each of the first lower portion 141 and the first side portion 142 of the first electrode 140.

Each of the second electrode 145 may include the second lower portion 146 disposed on a portion of the lower surface of the first semiconductor layer 105, the second side portion 147 disposed on a portion of the side surface of each of the first semiconductor layer 105, the active layer 110, and the second semiconductor layer 115, and the second upper portion 148 disposed on a portion of the upper surface of the second semiconductor layer 115.

In this embodiment, because each of the first electrode 140 and the second electrode 145 has the upper portion, the side portion, and the lower portion, even when the light-emitting device ED2 is turned upside down during the process of being transferred to an array substrate of a display apparatus, the light-emitting device ED2 may be electrically connected normally to the array substrate.

Moreover, in this embodiment, the light-emitting device ED2 may include the plurality of first electrodes 140 spaced apart from each other and the plurality of second electrodes 145 spaced apart from each other. Thus, when each of the first electrode 140 and the second electrode 145 includes an opaque metal, light extraction loss may be reduced. When the light-emitting device ED2 is mounted on the array substrate of the display apparatus, electrical connection thereof with a connection electrode may be guaranteed.

Figures 3A, 3B:
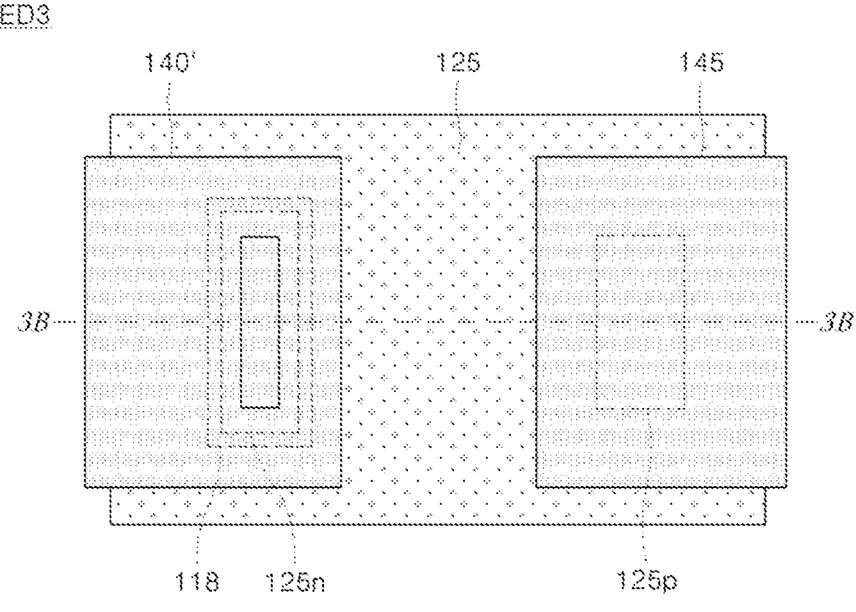
FIG. 3A shows a light-emitting device according to another embodiment of the present disclosure.
FIG. 3B shows a cross-sectional view of the light-emitting device shown in FIG. 3A.

FIG. 3A shows a light-emitting device ED3 according to one embodiment of the present disclosure. FIG. 3B is a cross-sectional view along line "3B-3B" in FIG. 3A.

Referring to FIGS. 3A and 3B, the light-emitting device ED3 according to an embodiment of the present disclosure may include a light-emitting structure 120', the passivation layer 125, a first electrode 140', and the second electrode 145. The maximum horizontal width of the light-emitting device ED3 may be, for example, 100 μm or smaller. The light-emitting device ED3 may be referred to as a micro light-emitting diode LED.

The light-emitting structure 120' may include a first semiconductor layer 105', an active layer 110', and a second semiconductor layer 115'. The light-emitting structure 120' may include a via hole 118 extending through the active layer 110' and the second semiconductor layer 115' so as to expose a portion of the first semiconductor layer 105'. The via hole 118 may extend into an upper portion of the first semiconductor layer 105'.

The first semiconductor layer 105', the active layer 110', and the second semiconductor layer 115' may be made of the same materials as those of the first semiconductor layer 105, the active layer 110, and the second semiconductor layer 115 in FIG. 1, respectively.

The light-emitting structure 120' may be surrounded with the passivation layer 125. The passivation layer 125 may cover surfaces of the light-emitting structure 120'. The passivation layer 125 may cover an upper surface, side surfaces, and a lower surface of the light-emitting structure 120'. The passivation layer 125 may also be disposed within the via hole 118.

The passivation layer 125 may include the first open area 125*n* disposed within the via hole 118 and exposing a portion of the first semiconductor layer 105' and the second open area 125*p* exposing a portion of the second semiconductor layer 115'.

The first electrode 140' is connected to the first semiconductor layer 105' through the first open area 125*n* in the via hole 118, and the second electrode 145 is connected to the second semiconductor layer 115' through the second open area 125*p*. The first electrode 140' and the second electrode 145 are spaced apart from each other.

The first electrode 140' connected to the first semiconductor layer 105' may include the first lower portion 141 disposed on a portion of the lower surface of the first semiconductor layer 105', the first side portion 142 disposed on a portion of the side surface of each of the first semiconductor layer 105', the active layer 110', and the second semiconductor layer 115', and a first upper portion 143' disposed on a portion of the upper surface of the second semiconductor layer 115' and extending into the via hole 118.

The first upper portion 143' of the first electrode 140' may contact the first semiconductor layer 105' through the first open area 125*n* of the passivation layer 125.

Since the passivation layer 125 is disposed between the first electrode 140' and the light-emitting structure 120', the first electrode 140' and the light-emitting structure 120' may be insulated from each other in an area other than the first open area 125$n$ of the passivation layer 125.

The first electrode 140' may be composed of a single layer or a plurality of layers made of at least one metal selected from nickel (Ni), gold (Au), platinum (Pt), titanium (Ti), aluminum (Al), chromium (Cr), and copper (Cu) or an alloy thereof.

The second electrode 145 may have the same structure as that of and be made of the same material as that of the second electrode 145 in FIGS. 1A and 1B.

In this embodiment, because each of the first electrode 140' and the second electrode 145 has the upper portion, the side portion, and the lower portion, even when the light-emitting device ED3 is turned upside down during the process of being transferred to an array substrate of a display apparatus, the light-emitting device ED3 may be electrically connected normally to the array substrate.

Figure 4A:
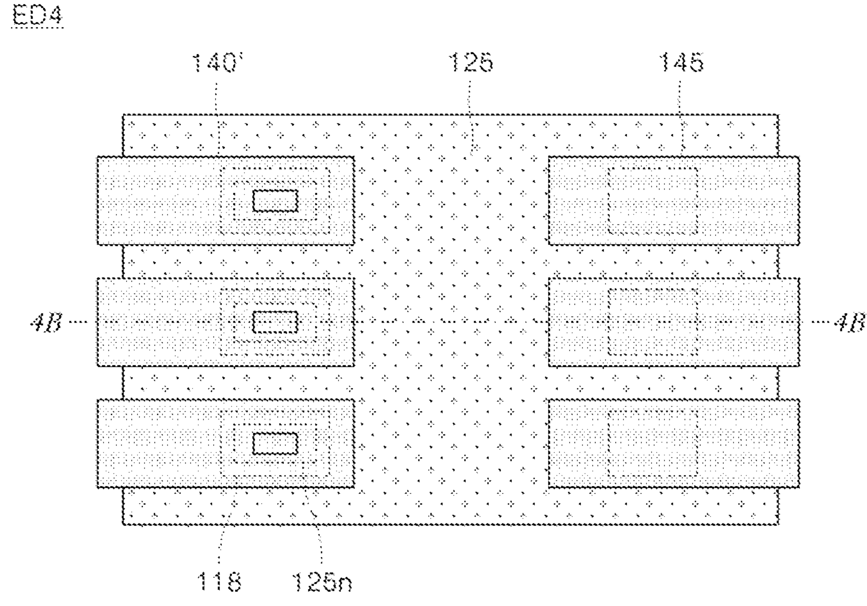
FIG. 4A shows a light-emitting device ED4 according to yet another embodiment of the present disclosure.
Figure 4B:
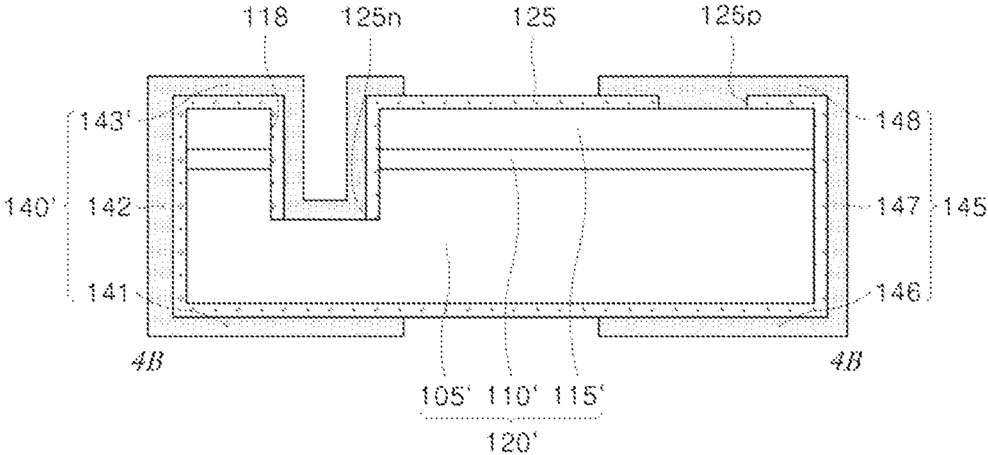
FIG. 4B shows a cross-sectional view of the light-emitting device shown in FIG. 4A.

FIG. 4A shows a light-emitting device ED4 according to one embodiment of the present disclosure. FIG. 4B is a cross-sectional view along line "4B-4B" in FIG. 4A.

Referring to FIGS. 4A and 4B, the light-emitting device ED4 according to an embodiment of the present disclosure may include the light-emitting structure 120', the passivation layer 125, a plurality of first electrodes 140' spaced apart from each other, and a plurality of second electrodes 145 spaced apart from each other. The maximum horizontal width of the light-emitting device ED4 may be, for example, 100 μm or smaller. The light-emitting device ED4 may be referred to as a micro light-emitting diode LED.

The light-emitting structure 120' may include the first semiconductor layer 105', the active layer 110', and the second semiconductor layer 115'. The light-emitting structure 120' may include a plurality of via holes 118 which extend through the active layer 110' and the second semiconductor layer 115' so as to respectively expose portions of the first semiconductor layer 105'. The plurality of via holes 118 may extend into an upper portion of the first semiconductor layer 105'.

The light-emitting structure 120' may be surrounded with the passivation layer 125. The passivation layer 125 may cover the surfaces of the light-emitting structure 120'. The passivation layer 125 may cover the upper surface, the side surface, and the lower surface of the light-emitting structure 120'. The passivation layer 125 may include a plurality of first open areas 125$n$ respectively exposing portions of the first semiconductor layer 105', and a plurality of second open areas 125$p$ respectively exposing portions of the second semiconductor layer 115'. Each of the plurality of first open areas 125$n$ is disposed within a corresponding one of the plurality of via holes 118.

FIGS. 4A and 4B show three first electrodes 140' and three second electrodes 145. However, this is an example. The number of the first electrodes 140' and the number of the second electrodes 145 are not limited to what are shown.

Each of the first electrodes 140' may include the first lower portion 141 disposed on a portion of the lower surface of the first semiconductor layer 105', the first side portion 142 disposed on a portion of the side surface of each of the first semiconductor layer 105', the active layer 110', and the second semiconductor layer 115', and a first upper portion 143' disposed on a portion of the upper surface of the second semiconductor layer 115' and extending into the via hole 118.

The first upper portion 143' of the first electrode 140' may contact the first semiconductor layer 105' through the first open area 125$n$ of the passivation layer 125.

Each of the second electrodes 145 may have the same structure as that of and be made of the same material as that of the second electrode 145 in FIGS. 2A and 2B.

In this embodiment, because each of the first electrode 140' and the second electrode 145 has the upper portion, the side portion, and the lower portion, even when the light-emitting device ED4 is turned upside down during the process of being transferred to an array substrate of a display apparatus, the light-emitting device ED4 may be electrically connected normally to the array substrate.

Moreover, in this embodiment, the light-emitting device ED4 may include the plurality of first electrodes 140' spaced apart from each other and the plurality of second electrodes 145 spaced apart from each other. Thus, when each of the first electrode 140' and the second electrode 145 includes an opaque metal, light extraction loss may be reduced. When the light-emitting device ED4 is mounted on the array substrate of the display apparatus, electrical connection thereof with a connection electrode may be guaranteed.

FIGS. 5 to 11 are cross-sectional views showing display apparatuses according to embodiments of the present disclosure.

Figure 5:
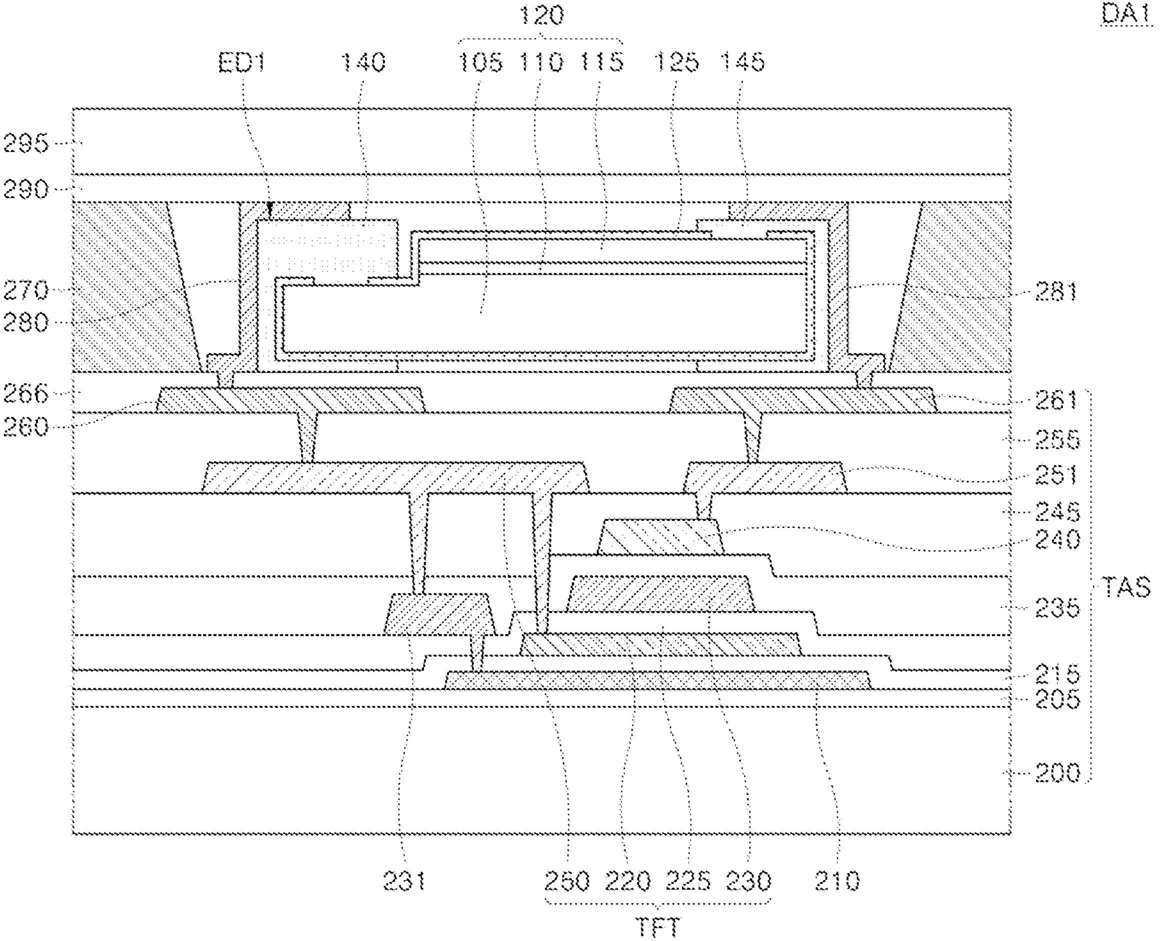
FIG. 5 is a cross-sectional view showing a display apparatus according to an embodiment of the present disclosure.
Figure 6:
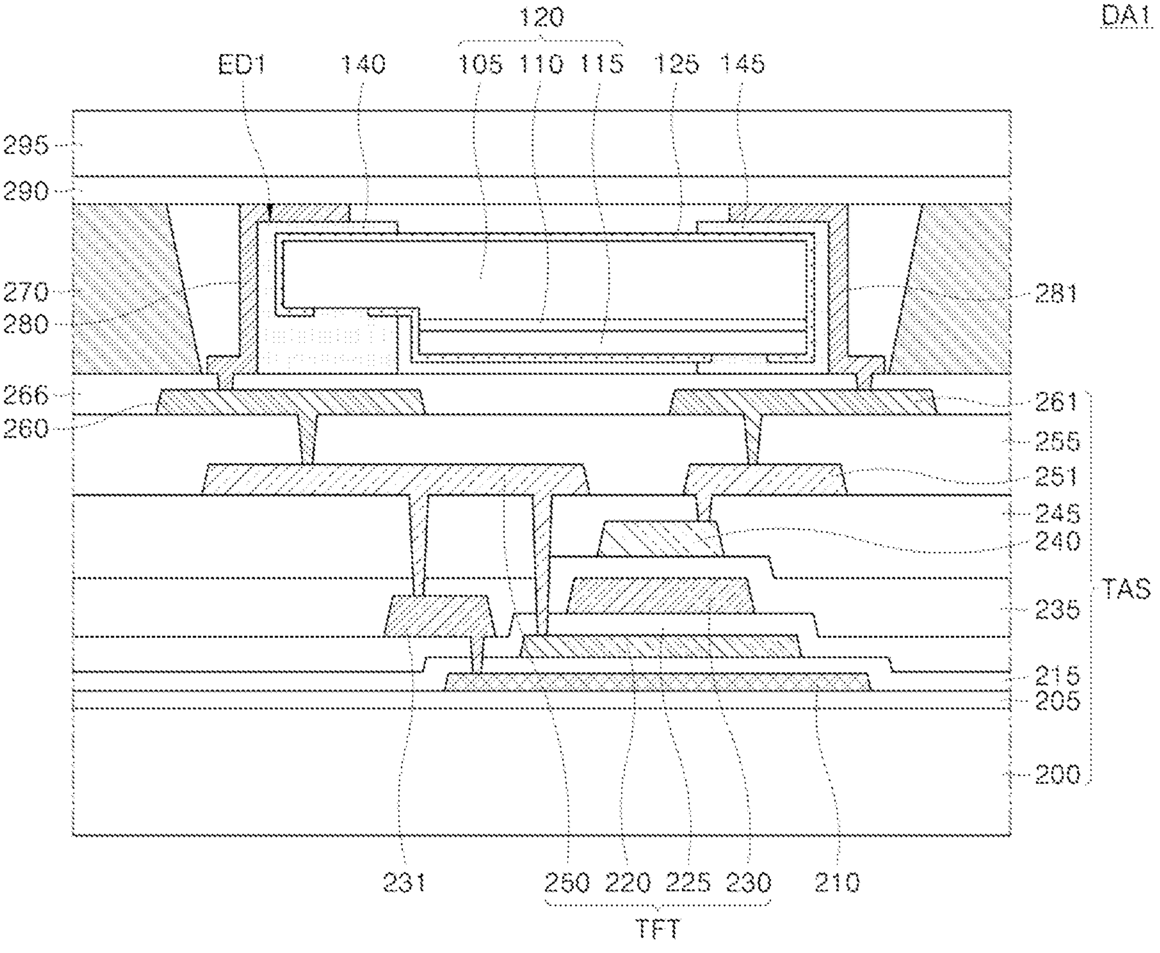
FIG. 6 is a cross-sectional view showing a display apparatus according to another embodiment of the present disclosure.

FIG. 5 and FIG. 6 are cross-sectional views showing a display apparatus DA1 according to an embodiment of the present disclosure. FIG. 5 and FIG. 6 show a cross-sectional structure of one sub-pixel of the display apparatus DA1 according to an embodiment of the present disclosure.

Referring to FIG. 5, the display apparatus DA1 according to an embodiment of the present disclosure may include an array substrate TAS and the light-emitting device ED1 mounted on the array substrate TAS. FIG. 5 shows that the light-emitting device ED1 as shown in FIG. 1 is installed thereon. However, the light-emitting device ED2 as shown in FIG. 2 may be installed thereon. The light-emitting device ED1 may be mounted on the array substrate TAS in a transfer process.

The array substrate TAS may include a pixel driver circuit for driving the light-emitting device ED1. For example, the array substrate TAS may include a base substrate 200 and a thin-film transistor TFT, wirings, and electrodes, etc., disposed on the base substrate 200.

The thin-film transistor TFT may include a semiconductor layer 220 formed on the base substrate 200, a gate electrode 230 disposed on the semiconductor layer 220, a gate insulating layer 225 disposed between the semiconductor layer 220 and the gate electrode 230, and a source/drain electrode 250.

A buffer layer 205 and a light-blocking layer 210 may be disposed between the base substrate 200 and the semiconductor layer 220. However, the present disclosure is not limited to thereto.

The buffer layer 205 may prevent impurities or moisture from diffusing from the base substrate 200 toward the thin-film transistor TFT, and may include an inorganic insulating material. In one example, the buffer layer 205 may include silicon nitride or silicon oxide. The buffer layer 205 may be formed as a single layer or multiple layers.

For example, when the semiconductor layer 220 may include a metal oxide semiconductor, the light-blocking layer 210 serves to prevent light from being incident into the semiconductor layer 220. A size of the light-blocking layer 210 is preferably larger than a size of the semiconductor layer 220 so as to entirely cover the semiconductor layer 220. The light-blocking layer 210 may include, for example, a first layer including titanium (Ti), and a second layer including at least one of molybdenum (Mo), copper (Cu), aluminum (Al), silver (Ag), chromium (Cr), gold (Au), neodymium (Nd), and nickel (Ni).

A first interlayer insulating layer 215 may be disposed between the buffer layer 205, the light-blocking layer 210 and the semiconductor layer 220.

The gate electrode 230 may be disposed on the gate insulating layer 225 so as to overlap a portion of the semiconductor layer 220. A first interlayer connection electrode 231 may be disposed on the gate insulating layer 225 and spaced apart from the gate electrode 230. The first interlayer connection electrode 231 may extend through the gate insulating layer 225 and the first interlayer insulating layer 215 so as to contact the light-blocking layer 210.

A second interlayer insulating layer 235 and a third interlayer insulating layer 245 may be sequentially disposed on the gate electrode 230 and the first interlayer connection electrode 231.

A connection wiring 240 disposed on the second interlayer insulating layer 235 may be covered with the third interlayer insulating layer 245. The source/drain electrode 250 and a second interlayer connection electrode 251 may be disposed on the third interlayer insulating layer 245.

The source/drain electrode 250 may extend through the third interlayer insulating layer 245, the second interlayer insulating layer 235, and the gate insulating layer 225 so as to contact the semiconductor layer 220. Moreover, the source/drain electrode 250 may extend through the third interlayer insulating layer 245 and the second interlayer insulating layer 235 so as to contact the first interlayer connection electrode 231.

A planarization layer 255 is disposed on the third interlayer insulating layer 245. The planarization layer 255 may cover the source/drain electrode 250 of the thin-film transistor TFT.

A first pad electrode 260 and a second pad electrode 261 may be disposed on the planarization layer 255 and spaced apart from each other. The first pad electrode 260 may extend through the planarization layer 255 so as to contact the source/drain electrode 250, while the second pad electrode 261 may extend through the planarization layer 255 so as to contact the second interlayer connection electrode 251.

An adhesive layer 266 may be disposed on the planarization layer 255 while covering the first pad electrode 260 and the second pad electrode 261. The adhesive layer 266 may be disposed to attach the light-emitting device ED1 to the array substrate TAS.

The light-emitting device ED1 may be disposed on the adhesive layer 266. The light-emitting device ED1 may be attached to the adhesive layer 266 in a transfer process.

A first connection electrode 280 connected to the first electrode 140 of the light-emitting device ED1 and a second connection electrode 281 connected to the second electrode 145 of the light-emitting device ED1 may be disposed on the light-emitting device ED1 and the adhesive layer 266.

The first connection electrode 280 may contact the first upper portion, the first side portion, and the first lower portion of the first electrode 140 of the light-emitting device ED1. The first connection electrode 280 may contact at least the first lower portion of the first electrode 140 of the light-emitting device ED1. The second connection electrode 281 may contact the second upper portion, the second side portion, and the second lower portion of the second electrode 145 of the light-emitting device ED1. The second connection electrode 281 may contact at least the first lower portion of the second electrode 145 of the light-emitting device ED1.

The first connection electrode 280 may extend through the adhesive layer 266 so as to contact the first pad electrode 260, while the second connection electrode 281 may extend through the adhesive layer 266 so as to contact the second pad electrode 261.

Each of the first connection electrode 280 and the second connection electrode 281 may include a transparent conductive oxide such as Indium Tin Oxide (ITO), Indium Gallium Zinc Oxide (IGZO), and Indium Zinc Oxide (IZO).

When a step coverage of a deposition process for forming the first connection electrode 280 and the second connection electrode 281 is poor, the first connection electrode 280 and the second connection electrode 281 may not be formed on the side surface of the light-emitting device ED1 or may be broken on the side surface of the light-emitting device ED1.

However, even in such a case, the first connection electrode 280 contacts the first lower portion of the first electrode 140 of the light-emitting device ED1, and the second connection electrode 281 contacts the second lower portion of the second electrode 145 of the light-emitting device ED1, such that the light-emitting device ED1 may be normally electrically connected to the array substrate TAS via the first connection electrode 280 and the second connection electrode 281.

A black matrix 270 may be disposed on the adhesive layer 266. The black matrix 270 may be disposed around the light-emitting device ED1.

A cover layer 295 may be disposed on the light-emitting device ED1 and the black matrix 270. The cover layer 295 may be attached to the light-emitting device ED1 and the black matrix 270 using an optically clear adhesive (OCA) 290. The cover layer 295 may include a functional optical film such as an anti-shatter film.

Referring to FIG. 6, the display apparatus DA1 may include the light-emitting device ED1 as turned upside down. The first connection electrode 280 may contact the first upper portion, the first side portion, and the first lower portion of the first electrode 140 of the light-emitting device ED1. The first connection electrode 280 may contact at least the first upper portion of the first electrode 140 of the light-emitting device ED1. The second connection electrode 281 may contact the second upper portion, the second side portion, and the second lower portion of the second electrode 145 of the light-emitting device ED1. The second connection electrode 281 may contact at least the first upper portion of the second electrode 145 of the light-emitting device ED1.

When the step coverage of the deposition process for forming the first connection electrode 280 and the second connection electrode 281 is poor, the first connection electrode 280 and the second connection electrode 281 may not be formed on the side surface of the light-emitting device ED1 or may be broken on the side surface of the light-emitting device ED1.

However, even in such a case, the first connection electrode 280 is in contact with the first upper portion of the first electrode 140 of the light-emitting device ED1, and the second connection electrode 281 is in contact with the first upper portion of the second electrode 145 of the light-emitting device ED1 such that the light-emitting device ED1 may be normally electrically connected to the array substrate TAS via the first connection electrode 280 and the second connection electrode 281.

Each of the first electrode 140 and the second electrode 145 of the light-emitting device ED1 has the upper portion, the side portion, and the lower portion. Thus, even when the light-emitting device ED1 is turned upside down during the transfer process thereof to the array substrate TAS of the display apparatus DA1, the light-emitting device ED1 may be electrically connected normally to the array substrate TAS.

Figure 7:
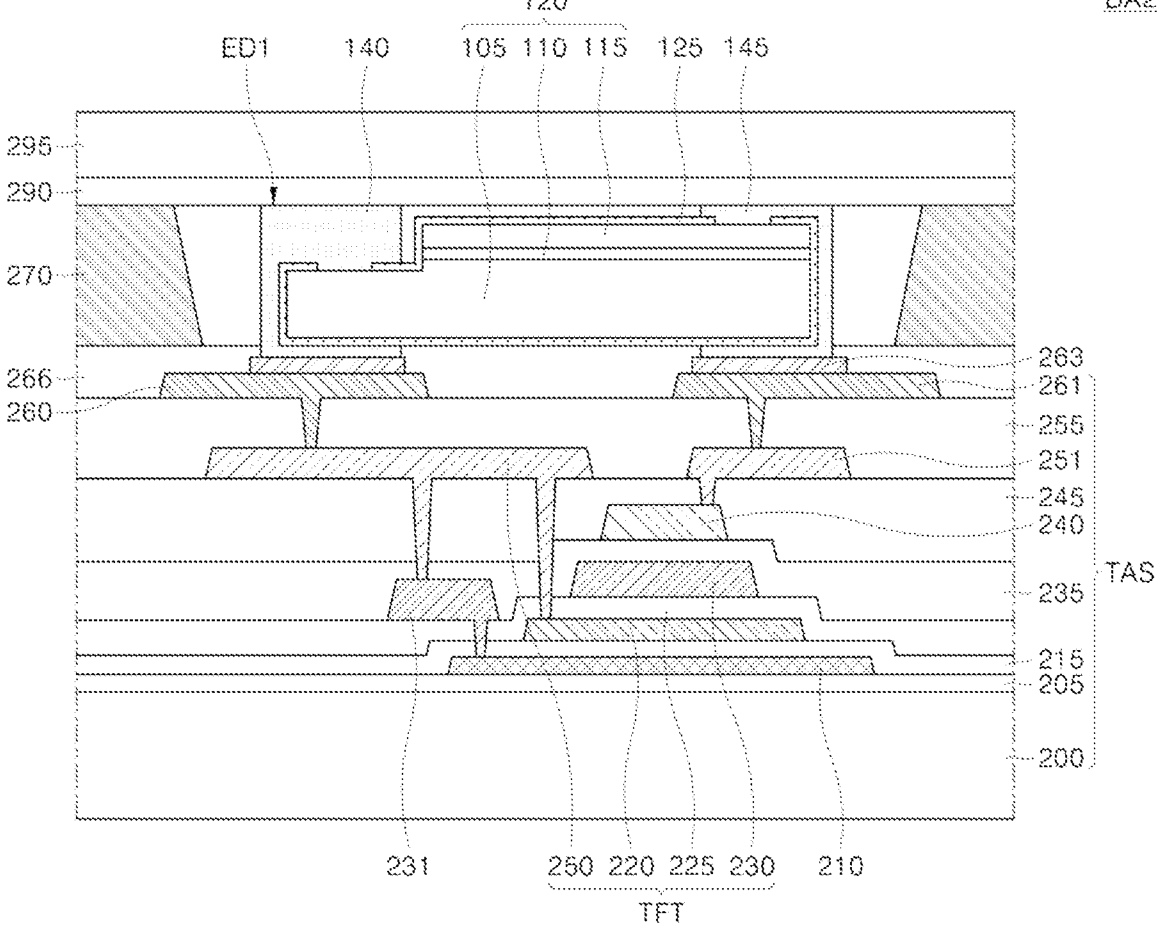
FIG. 7 is a cross-sectional view showing a display apparatus according to another embodiment of the present disclosure.

FIG. 7 is a cross-sectional view showing a display apparatus DA2 according to an embodiment of the present disclosure. FIG. 7 may show a cross-sectional structure of one sub-pixel of the display apparatus DA2 according to an embodiment of the present disclosure.

Referring to FIG. 7, the display apparatus DA2 according to an embodiment of the present disclosure may include the light-emitting device ED1 mounted on the array substrate TAS. FIG. 7 shows that the light-emitting device ED1 as shown in FIG. 1 is installed thereon. However, the light-emitting device ED2 as shown in FIG. 2 may be installed thereon. The light-emitting device ED1 may be mounted on the array substrate TAS in a transfer process.

A conductive adhesive layer 263 may be disposed on the first pad electrode 260 and the second pad electrode 261 of the array substrate TAS. Moreover, the adhesive layer 266 may be disposed on the planarization layer 255 of the array substrate TAS so as to cover the first pad electrode 260 and the second pad electrode 261.

The light-emitting device ED1 may be disposed on the conductive adhesive layer 263 and the adhesive layer 266. The first electrode 140 of the light-emitting device ED1 may be connected to the first pad electrode 260 via the conductive adhesive layer 263, and the second electrode 145 of the light-emitting device ED1 may be connected to the second pad electrode 261 via the conductive adhesive layer 263.

The first lower portion of the first electrode 140 of the light-emitting device ED1 may be connected to the first pad electrode 260 via the conductive adhesive layer 263. The second lower portion of the second electrode 145 thereof may be connected to the second pad electrode 261 via the conductive adhesive layer 263. The conductive adhesive layer 263 may act as a layer for mounting the light-emitting device ED1 on the array substrate, and may have adhesive property and include a conductive material.

FIG. 7 shows that the light-emitting device ED1 is not turned upside down. However, as shown in FIG. 6, the light-emitting device ED1 may be turned upside down. In this case, the first upper portion of the first electrode 140 of the light-emitting device ED1 may be connected to the first pad electrode 260 via the conductive adhesive layer 263. The second upper portion of the second electrode 145 of the light-emitting device ED1 may be connected to the second pad electrode 261 via the conductive adhesive layer 263.

Each of the first electrode 140 and the second electrode 145 of the light-emitting device ED1 has the upper portion, the side portion, and the lower portion. Thus, even when the light-emitting device ED1 is turned upside down during the transfer process thereof to the array substrate TAS of the display apparatus DA2, the light-emitting device ED1 may be electrically connected normally to the array substrate TAS and thus may operate normally.

Figure 8:
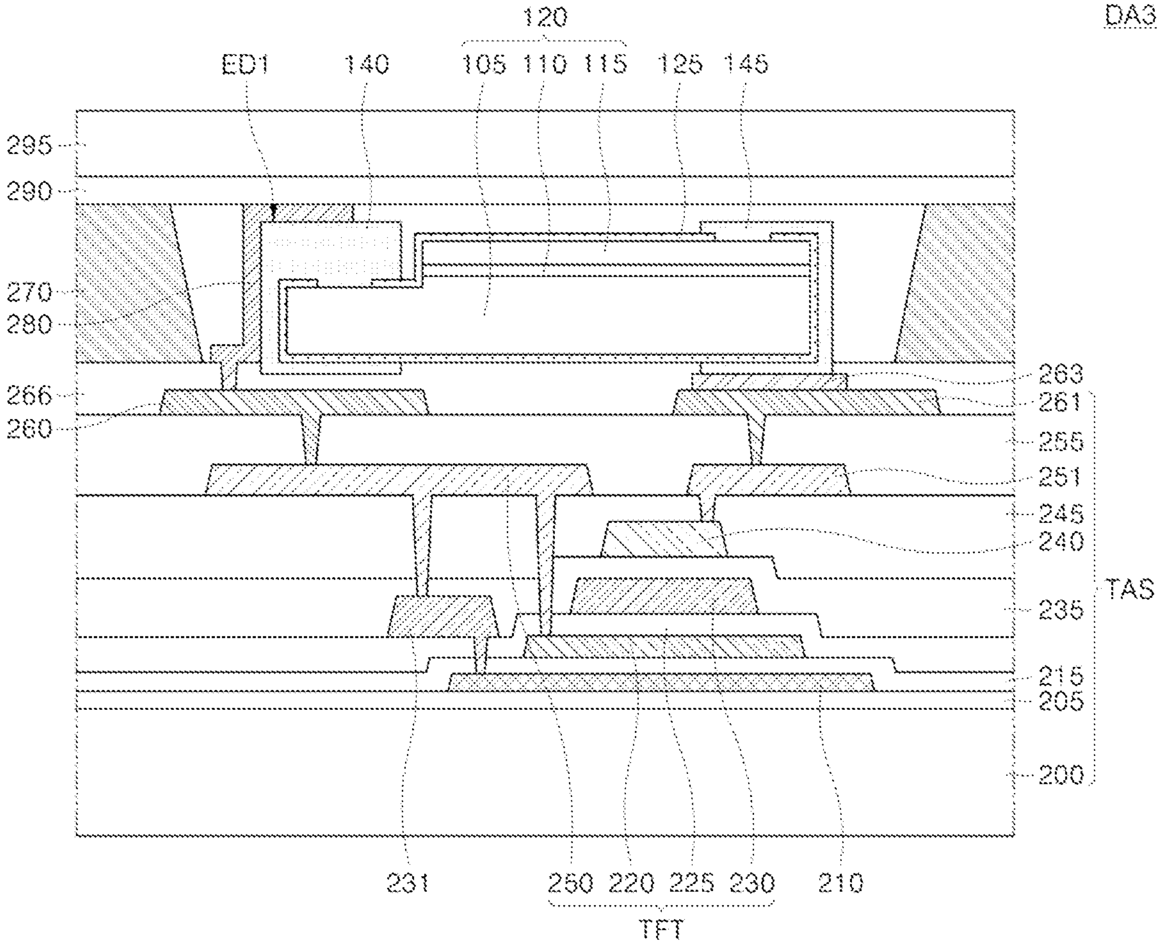
FIG. 8 is a cross-sectional view showing a display apparatus according to another embodiment of the present disclosure.

FIG. 8 is a cross-sectional view showing a display apparatus DA3 according to an embodiment of the present disclosure. FIG. 8 shows a cross-sectional structure of one sub-pixel of the display apparatus DA3 according to an embodiment of the present disclosure.

Referring to FIG. 8, the display apparatus DA3 according to an embodiment of the present disclosure may include the array substrate TAS and the light-emitting device ED1 mounted on the array substrate TAS. FIG. 8 shows that the light-emitting device ED1 as shown in FIG. 1 is installed thereon. However, the light-emitting device ED2 as shown in FIG. 2 may be installed thereon. The light-emitting device ED1 may be mounted on the array substrate TAS in a transfer process.

The conductive adhesive layer 263 may be disposed on either the first pad electrode 260 or the second pad electrode 261 of the array substrate TAS. For example, the conductive adhesive layer 263 may be disposed on the second pad electrode 261. Unlike what is shown in FIG. 8, the conductive adhesive layer 263 may be disposed on the first pad electrode 260.

Moreover, the adhesive layer 266 may be disposed on the planarization layer 255 of the array substrate TAS so as to cover the first pad electrode 260 and the second pad electrode 261.

The light-emitting device ED1 may be disposed on the conductive adhesive layer 263 and the adhesive layer 266.

Moreover, for example, when the conductive adhesive layer 263 is disposed on the second pad electrode 261, the first connection electrode 280 connected to the first electrode 140 of the light-emitting device ED1 may be disposed on the light-emitting device ED1 and the adhesive layer 266.

The first connection electrode 280 may contact the first upper portion, the first side portion, and the first lower portion of the first electrode 140 of the light-emitting device ED1. The first connection electrode 280 may contact at least the first lower portion of the first electrode 140 of the light-emitting device ED1.

The first connection electrode 280 may extend through the adhesive layer 266 so as to contact the first pad electrode 260. The first electrode 140 of the light-emitting device ED1 may be connected to the first pad electrode 260 via the first connection electrode 280.

The second electrode 145 of the light-emitting device ED1 may be connected to the second pad electrode 261 via the conductive adhesive layer 263. The second lower portion of the second electrode 145 of the light-emitting device ED1 may be connected to the second pad electrode 261 via the conductive adhesive layer 263.

Unlike what is shown in FIG. 8, when the conductive adhesive layer 263 is disposed on the first pad electrode 260, the second connection electrode 281 connected to the second electrode 145 of the light-emitting device ED1 may be disposed on the light-emitting device ED1 and the adhesive layer 266. The second connection electrode 281 may extend through the adhesive layer 266 so as to contact the second pad electrode 261.

FIG. 8 shows that the light-emitting device ED1 is not turned upside down. However, as shown in FIG. 6, the light-emitting device ED1 may be turned upside down. In this case, the first connection electrode 280 may contact the first upper portion, the first side portion, and the first lower portion of the first electrode 140 of the light-emitting device ED1. The first connection electrode 280 may contact at least the first upper portion of the first electrode 140 of the light-emitting device ED1. The second upper portion of the second electrode 145 of the light-emitting device ED1 may be connected to the second pad electrode 261 via the conductive adhesive layer 263.

Each of the first electrode 140 and the second electrode 145 of the light-emitting device ED1 has the upper portion, the side portion, and the lower portion. Thus, even when the light-emitting device ED1 is turned upside down during the transfer process thereof to the array substrate TAS of the display apparatus DA3, the light-emitting device ED1 may be electrically connected normally to the array substrate TAS and thus may operate normally.

Figure 9:
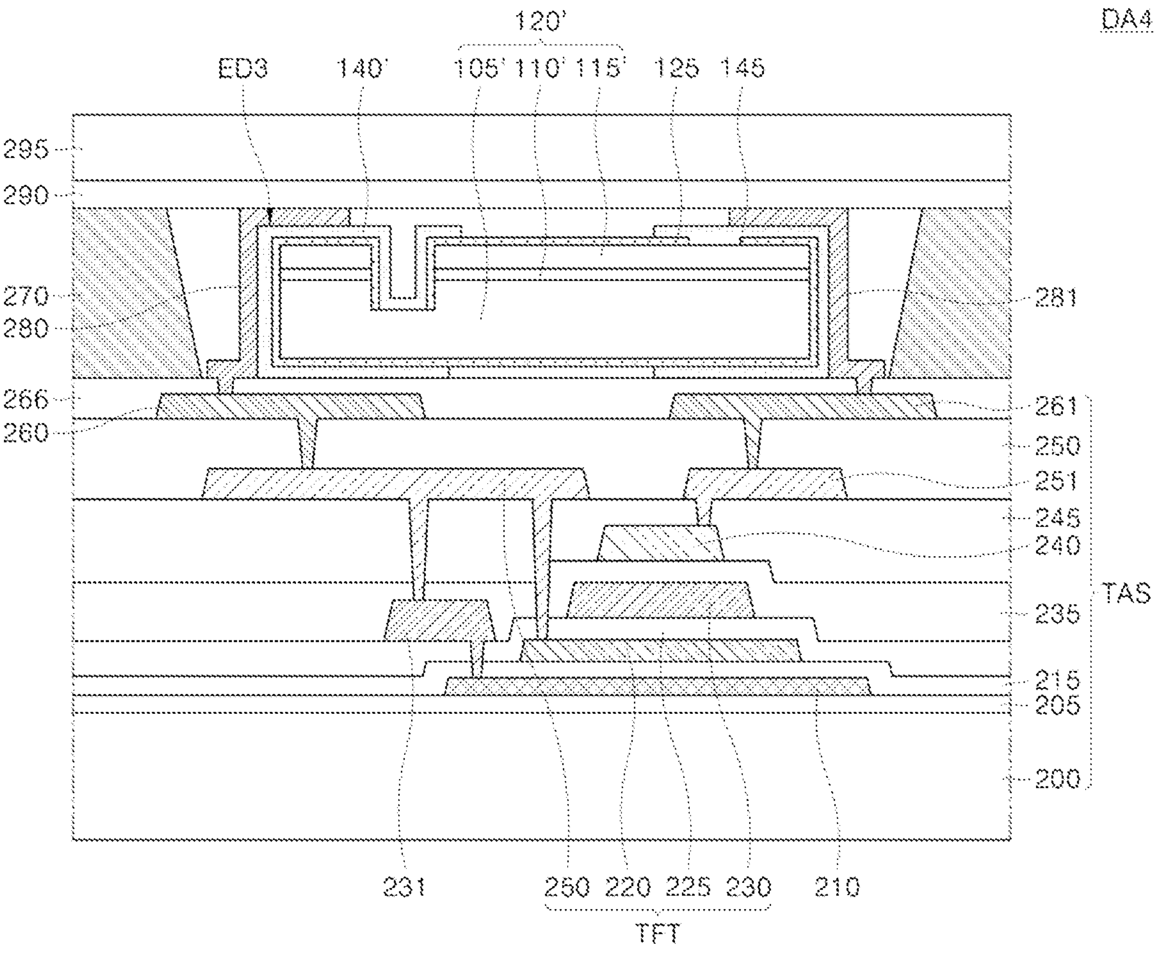
FIG. 9 is a cross-sectional view showing a display apparatus according to an embodiment of the present disclosure.
Figure 10:
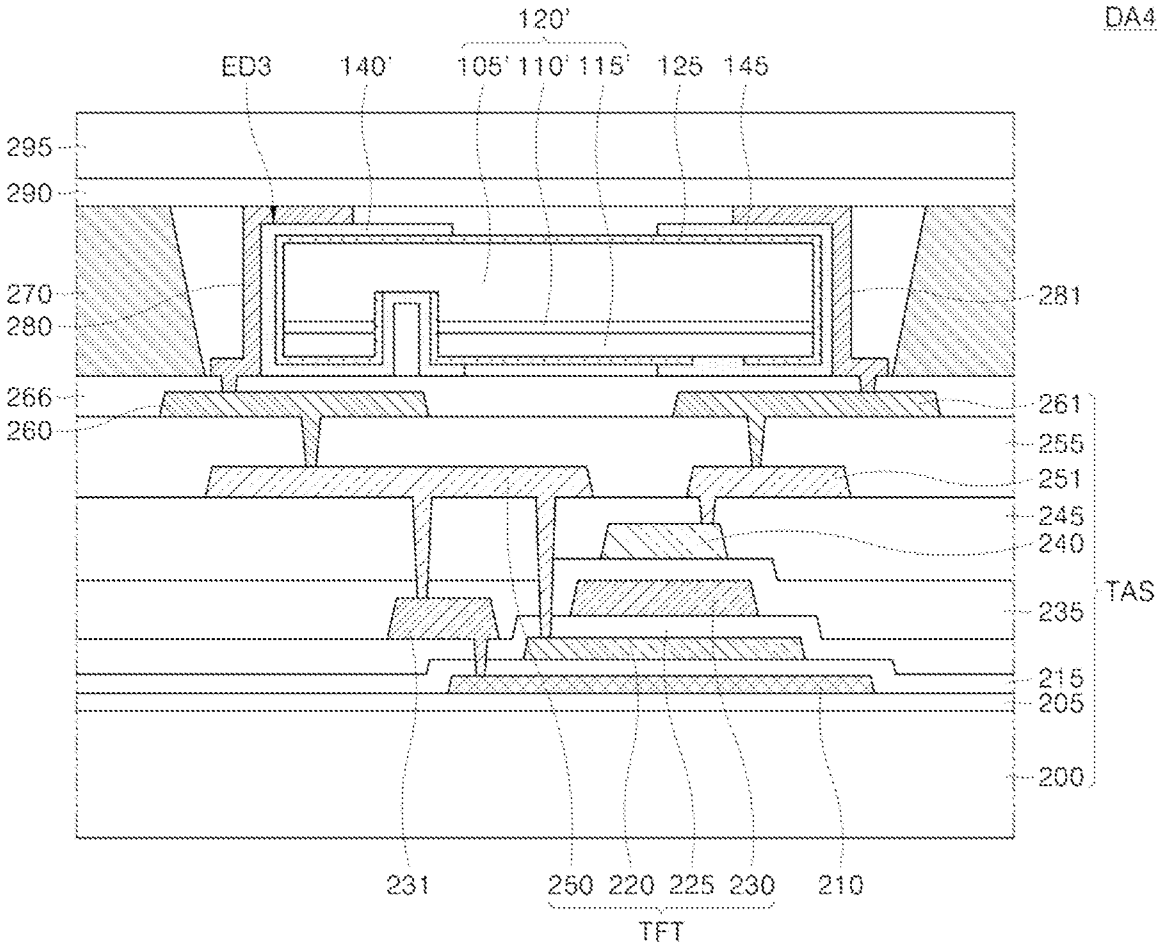
FIG. 10 is a cross-sectional view showing a display apparatus according to another embodiment of the present disclosure.

FIG. 9 and FIG. 10 are cross-sectional views showing a display apparatus DA4 according to an embodiment of the present disclosure. FIG. 9 and FIG. 10 show a cross-sectional structure of one sub-pixel of the display apparatus DA4 according to one embodiment of the present disclosure.

Referring to FIG. 9, the display apparatus DA4 according to an embodiment of the present disclosure may include the array substrate TAS and the light-emitting device ED3 mounted on the array substrate TAS. FIG. 9 shows that the light-emitting device ED3 as shown in FIG. 3 is installed thereon. However, the light-emitting device ED4 as shown in FIG. 4 may be installed thereon. The light-emitting device ED3 may be mounted on the array substrate TAS in a transfer process.

The adhesive layer 266 may be disposed on the planarization layer 255 of the array substrate TAS so as to cover the first pad electrode 260 and the second pad electrode 261.

The light-emitting device ED3 may be disposed on the adhesive layer 266. Moreover, the first connection electrode 280 connected to the first electrode 140' of the light-emitting device ED3 and the second connection electrode 281 connected to the second electrode 145 of the light-emitting device ED3 may be disposed on the light-emitting device ED3 and the adhesive layer 266.

The first connection electrode 280 may contact the first upper portion, the first side portion, and the first lower portion of the first electrode 140' of the light-emitting device ED3. The first connection electrode 280 may be in contact with at least the first lower portion of the first electrode 140' of the light-emitting device ED3.

The second connection electrode 281 may contact the first upper portion, the first side portion, and the first lower portion of the second electrode 145 of the light-emitting device ED3. The second connection electrode 281 may contact at least the first lower portion of the second electrode 145 of the light-emitting device ED3.

The first electrode 140' of the light-emitting device ED3 may be connected to the first pad electrode 260 via the first connection electrode 280. The second electrode 145 of the light-emitting device ED3 may be connected to the second pad electrode 261 via the second connection electrode 281.

Referring to FIG. 10, the display apparatus DA4 may include the light-emitting device ED3 as turned upside down. In this case, the first connection electrode 280 may contact the first upper portion, the first side portion, and the first lower portion of the first electrode 140' of the light-emitting device ED3. The first connection electrode 280 may be in contact with at least the first upper portion of the first electrode 140' of the light-emitting device ED3. The second connection electrode 281 may contact the first upper portion, the first side portion, and the first lower portion of the second electrode 145 of the light-emitting device ED3. The second connection electrode 281 may contact at least the first upper portion of the second electrode 145 of the light-emitting device ED3.

Each of the first electrode 140' and the second electrode 145 of the light-emitting device ED3 has the upper portion, the side portion, and the lower portion. Thus, even when the light-emitting device ED3 is turned upside down during the process of being transferred to the array substrate TAS of the display apparatus DA4, the light-emitting device ED3 may be electrically connected normally to the array substrate TAS and thus may operate normally.

Figure 11:
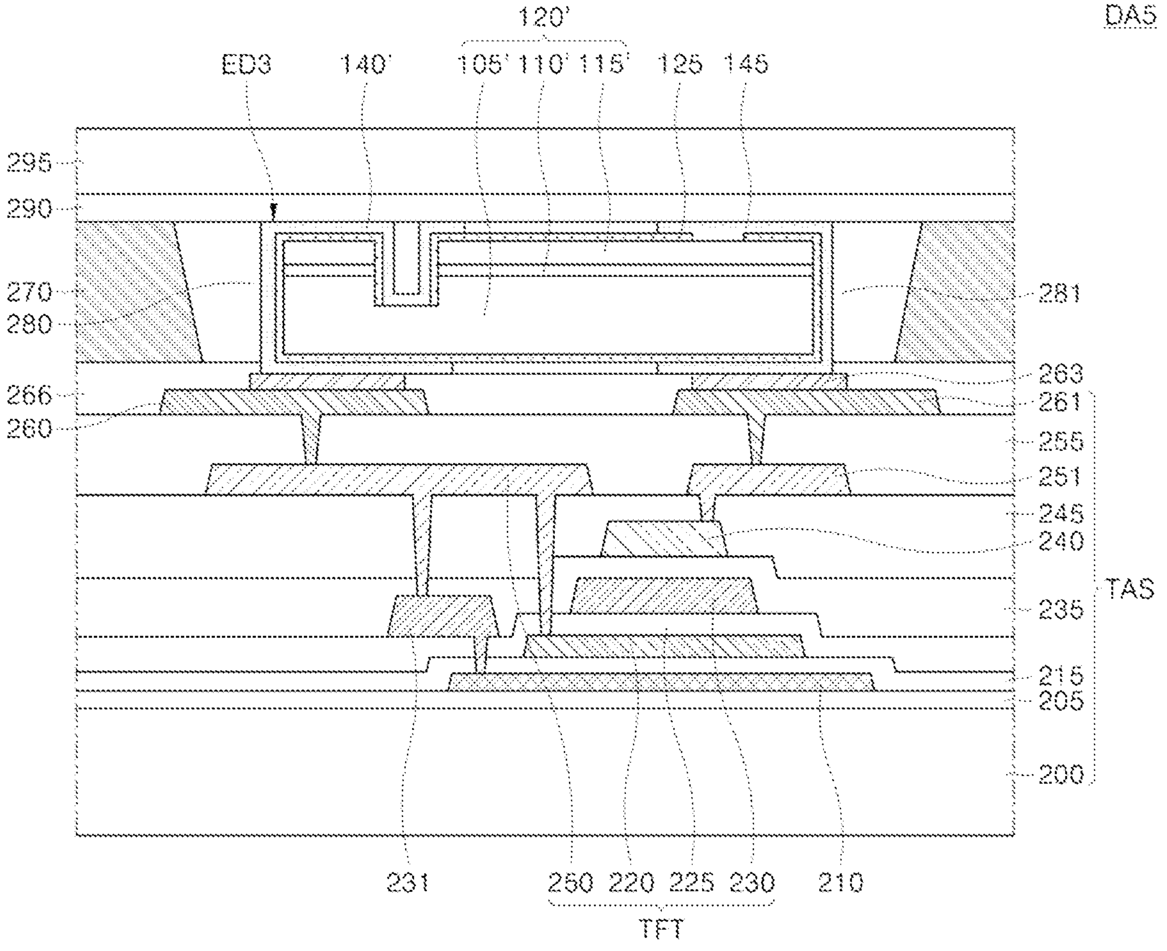
FIG. 11 is a cross-sectional view showing a display apparatus according to another embodiment of the present disclosure.

FIG. 11 is a cross-sectional view showing a display apparatus DA5 according to an embodiment of the present disclosure. FIG. 11 shows a cross-sectional structure of one sub-pixel of the display apparatus DA5 according to an embodiment of the present disclosure.

Referring to FIG. 11, the display apparatus DA5 according to an embodiment of the present disclosure may include the array substrate TAS and the light-emitting device ED3 mounted on the array substrate TAS. FIG. 11 shows that the light-emitting device ED3 as shown in FIG. 3 is installed thereon. However, the light-emitting device ED4 as shown in FIG. 4 may be installed thereon. The light-emitting device ED3 may be mounted on the array substrate TAS in a transfer process.

The conductive adhesive layer 263 may be disposed on each of the first pad electrode 260 and the second pad electrode 261 of the array substrate TAS. Moreover, the adhesive layer 266 may be disposed on the planarization layer 255 of the array substrate TAS so as to cover the first pad electrode 260 and the second pad electrode 261.

The light-emitting device ED3 may be disposed on the conductive adhesive layer 263 and the adhesive layer 266. The first electrode 140' of the light-emitting device ED3 may be connected to the first pad electrode 260 via the conductive adhesive layer 263, and the second electrode 145 of the light-emitting device ED3 may be connected to the second pad electrode 261 via the conductive adhesive layer 263. The first lower portion of the first electrode 140' of the light-emitting device ED3 may be connected to the first pad electrode 260 via the conductive adhesive layer 263, while the second lower portion of the second electrode 145 of the light-emitting device ED3 may be connected to the second pad electrode 261 via the conductive adhesive layer 263.

FIG. 11 shows that the light-emitting device ED3 is not turned upside down. However, as shown in FIG. 10, the light-emitting device ED3 may be turned upside down. In this case, the first upper portion of the first electrode 140' of the light-emitting device ED3 may be connected to the first pad electrode 260 via the conductive adhesive layer 263, while the second upper portion of the second electrode 145 of the light-emitting device ED3 may be connected to the second pad electrode 261 via the conductive adhesive layer 263.

Each of the first electrode 140' and the second electrode 145 of the light-emitting device ED3 has the upper portion, the side portion, and the lower portion. Thus, even when the light-emitting device ED3 is turned upside down during the process of being transferred to the array substrate TAS of the display apparatus DA5, the light-emitting device ED3 may be electrically connected normally to the array substrate TAS and thus may operate normally.

Figure 12:
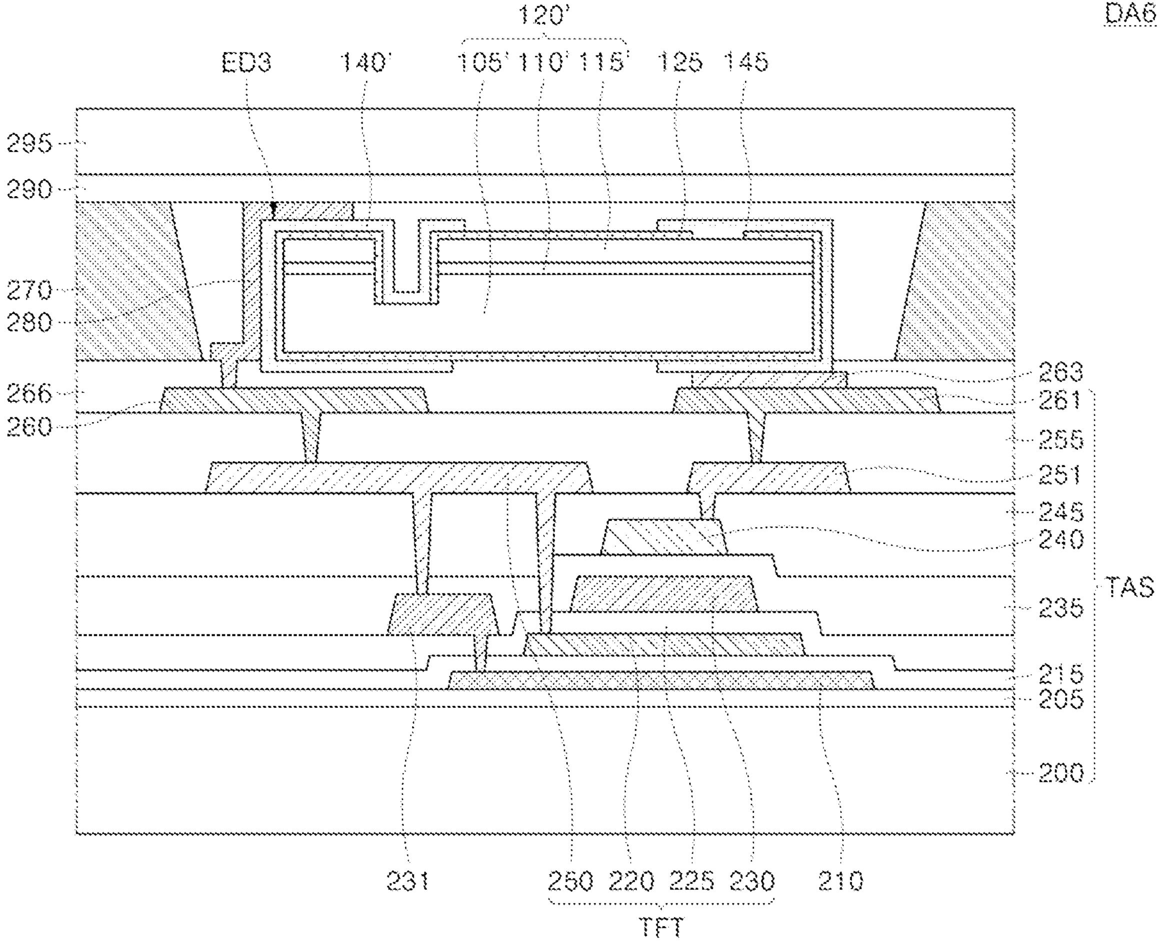
FIG. 12 is a cross-sectional view showing a display apparatus according to yet another embodiment of the present disclosure

FIG. 12 is a cross-sectional view showing a display apparatus DA6 according to an embodiment of the present disclosure. FIG. 12 shows a cross-sectional structure of one sub-pixel of the display apparatus DA6 according to an embodiment of the present disclosure.

Referring to FIG. 12, the display apparatus DA6 according to an embodiment of the present disclosure may include the array substrate TAS and the light-emitting device ED3 mounted on the array substrate TAS. FIG. 12 shows that the light-emitting device ED3 as shown in FIG. 3 is installed thereon. However, the light-emitting device ED4 as shown in FIG. 4 may be installed thereon. The light-emitting device ED3 may be mounted on the array substrate TAS in a transfer process.

The conductive adhesive layer 263 may be disposed on either the first pad electrode 260 or the second pad electrode 261 of the array substrate TAS. For example, the conductive adhesive layer 263 may be disposed on the second pad electrode 261. Unlike what is shown in FIG. 12, the conductive adhesive layer 263 may be disposed on the first pad electrode 260.

Moreover, the adhesive layer 266 may be disposed on the planarization layer 255 of the array substrate TAS so as to cover the first pad electrode 260 and the second pad electrode 261.

The light-emitting device ED3 may be disposed on the conductive adhesive layer 263 and the adhesive layer 266.

Moreover, for example, when the conductive adhesive layer 263 is disposed on the second pad electrode 261, the first connection electrode 280 connected to the first electrode 140' of the light-emitting device ED3 may be disposed on the light-emitting device ED3 and the adhesive layer 266.

The first connection electrode 280 may contact the first upper portion, the first side portion, and the first lower portion of the first electrode 140' of the light-emitting device ED3. The first connection electrode 280 may be in contact with at least the first lower portion of the first electrode 140' of the light-emitting device ED3. The first connection electrode 280 may extend through the adhesive layer 266 so as to contact the first pad electrode 260. The first electrode 140' of the light-emitting device ED3 may be connected to the first pad electrode 260 via the first connection electrode 280.

The second electrode 145 of the light-emitting device ED3 may be connected to the second pad electrode 261 via the conductive adhesive layer 263. The second lower portion of the second electrode 145 of the light-emitting device ED3 may be connected to the second pad electrode 261 via the conductive adhesive layer 263.

Unlike what is shown in FIG. 12, when the conductive adhesive layer 263 is disposed on the first pad electrode 260, the second connection electrode 281 connected to the second electrode 145 of the light-emitting device ED3 may be disposed on the light-emitting device ED3 and the adhesive layer 266. The second connection electrode 281 may extend through the adhesive layer 266 so as to contact the second pad electrode 261.

FIG. 12 shows that the light-emitting device ED3 is not turned upside down. However, as shown in FIG. 10, the light-emitting device ED3 may be turned upside down. In this case, the first connection electrode 280 may contact at least the first upper portion of the first electrode 140' of the light-emitting device ED3. The second upper portion of the second electrode 145 of the light-emitting device ED3 may be connected to the second pad electrode 261 via the conductive adhesive layer 263.

Each of the first electrode 140' and the second electrode 145 of the light-emitting device ED3 has the upper portion, the side portion, and the lower portion. Thus, even when the light-emitting device ED3 is turned upside down during the process of being transferred to the array substrate TAS of the display apparatus DA6, the light-emitting device ED3 may be electrically connected normally to the array substrate TAS and thus may operate normally.

The light-emitting devices and the display apparatus according to embodiments of the present disclosure may be described as follows.

A first aspect of the present disclosure provides a light-emitting device comprising: a light-emitting structure including a first semiconductor layer, an active layer and a second semiconductor layer; a passivation layer covering surfaces of the light-emitting structure; at least one first electrode connected to the first semiconductor layer; and at least one second electrode connected to the second semiconductor layer, wherein the at least one first electrode includes: a first upper portion extending through the passivation layer so as to contact the first semiconductor layer; a first side portion disposed on a portion of a side surface of the light-emitting structure; and a first lower portion disposed on a portion of a lower surface of the light-emitting structure, wherein the at least one second electrode includes: a second upper portion extending through the passivation layer so as to contact the second semiconductor layer; a second side portion disposed on a portion of the side surface of the light-emitting structure; and a second lower portion disposed on a portion of the lower surface of the light-emitting structure.

In some implementations of the light-emitting device of the present disclosure, each of the active layer and the second semiconductor layer is partially disposed on the first semiconductor layer.

In some implementations of the light-emitting device of the present disclosure, the first upper portion of the at least one first electrode is disposed on a portion of an upper surface of the first semiconductor layer, wherein the first side portion of the at least one first electrode is disposed on a portion of a side surface of the first semiconductor layer.

In some implementations of the light-emitting device of the present disclosure, a thickness (e.g., thickness T1 in FIG. 1B) of the first upper portion of the at least one first electrode is larger than a thickness (e.g., thickness T3 in FIG. 1B) of the first lower portion of the at least one first electrode.

In some implementations of the light-emitting device of the present disclosure, the light-emitting structure has at least one via hole extending through the second semiconductor layer and the active layer so as to expose a portion of the first semiconductor layer.

In some implementations of the light-emitting device of the present disclosure, the first upper portion of the at least one first electrode is disposed on a portion of an upper surface of the second semiconductor layer and is further disposed in the at least one via hole so as to contact the first semiconductor layer.

In some implementations of the light-emitting device of the present disclosure, the at least one first electrode includes a plurality of first electrodes spaced apart from each other, and the at least one second electrode includes a plurality of second electrodes spaced apart from each other.

A second aspect of the present disclosure provides a display apparatus comprising: an array substrate including a thin-film transistor, a first pad electrode connected to the thin-film transistor, and a second pad electrode spaced apart from the first pad electrode; an adhesive layer disposed on the first pad electrode and the second pad electrode; and a light-emitting device disposed on the adhesive layer, wherein the light-emitting device includes: a light-emitting structure including a first semiconductor layer, an active layer and a second semiconductor layer; a passivation layer covering surfaces of the light-emitting structure; at least one first electrode connected to the first semiconductor layer; and at least one second electrode connected to the second semiconductor layer, wherein the at least one first electrode includes: a first upper portion extending through the passivation layer so as to contact the first semiconductor layer; a first side portion disposed on a portion of a side surface of the light-emitting structure; and a first lower portion disposed on a portion of a lower surface of the light-emitting structure, wherein the at least one second electrode includes: a second upper portion extending through the passivation layer so as to contact the second semiconductor layer; a second side portion disposed on a portion of the side surface of the light-emitting structure; and a second lower portion disposed on a portion of the lower surface of the light-emitting structure.

In some implementations of the display apparatus of the present disclosure, each of the active layer and the second semiconductor layer is partially disposed on the first semiconductor layer.

In some implementations of the display apparatus of the present disclosure, the first upper portion of the at least one first electrode is disposed on a portion of an upper surface of the first semiconductor layer, wherein the first side portion of the at least one first electrode is disposed on a portion of a side surface of the first semiconductor layer.

In some implementations of the display apparatus of the present disclosure, a thickness (e.g., thickness T1 in FIG. 1B) of the first upper portion of the at least one first electrode is larger than a thickness (e.g., thickness T3 in FIG. 1B) of the first lower portion of the at least one first electrode.

In some implementations of the display apparatus of the present disclosure, the light-emitting structure has at least one via hole extending through the second semiconductor layer and the active layer so as to expose a portion of the first semiconductor layer.

In some implementations of the display apparatus of the present disclosure, the first upper portion of the at least one first electrode is disposed on a portion of an upper surface of the second semiconductor layer and is further disposed in the at least one via hole so as to contact the first semiconductor layer.

In some implementations of the display apparatus of the present disclosure, the at least one first electrode includes a plurality of first electrodes spaced apart from each other, and the at least one second electrode includes a plurality of second electrodes spaced apart from each other.

In some implementations of the display apparatus of the present disclosure, the display apparatus further comprises: a first connection electrode contacting at least the first lower portion or the first upper portion of the first electrode and extending through the adhesive layer so as to contact the first pad electrode; and a second connection electrode contacting at least the second lower portion or the second upper portion of the second electrode and extending through the adhesive layer so as to contact the second pad electrode.

In some implementations of the display apparatus of the present disclosure, the display apparatus further comprises: a first conductive adhesive layer disposed between the first electrode of the light-emitting device and the first pad electrode; and a second conductive adhesive layer disposed between the second electrode of the light-emitting device and the second pad electrode.

In some implementations of the display apparatus of the present disclosure, the display apparatus further comprises: a first connection electrode contacting at least the first lower portion of the first electrode and extending through the adhesive layer so as to contact the first pad electrode; and a conductive adhesive layer disposed between the second electrode and the second pad electrode.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light-emitting device comprising:

a light-emitting structure including a first semiconductor layer, an active layer, and a second semiconductor layer;

a passivation layer covering surfaces of the light-emitting structure;

at least one first electrode electrically connected to the first semiconductor layer; and at least one second electrode electrically connected to the second semiconductor layer, wherein the at least one first electrode includes:

a first upper portion extending through the passivation layer and contacting the first semiconductor layer;

a first side portion disposed on a portion of a side surface of the light-emitting structure; and a first lower portion disposed on a portion of a lower surface of the light-emitting structure, wherein the at least one second electrode includes:

a second upper portion extending through the passivation layer and contacting the second semiconductor layer;

a second side portion disposed on a portion of the side surface of the light-emitting structure; and a second lower portion disposed on a portion of the lower surface of the light-emitting structure.

2. The light-emitting device of claim 1, wherein each of the active layer and the second semiconductor layer is partially disposed on the first semiconductor layer.

3. The light-emitting device of claim 2, wherein the first upper portion of the at least one first electrode is disposed on a portion of an upper surface of the first semiconductor layer, wherein the first side portion of the at least one first electrode is disposed on a portion of a side surface of the first semiconductor layer.

4. The light-emitting device of claim 2, wherein a thickness of the first upper portion of the at least one first electrode is larger than a thickness of the first lower portion of the at least one first electrode.

5. The light-emitting device of claim 1, wherein the light-emitting structure has at least one via hole extending through the second semiconductor layer and the active layer and exposing a portion of the first semiconductor layer.

6. The light-emitting device of claim 5, wherein the first upper portion of the at least one first electrode is disposed on a portion of an upper surface of the second semiconductor layer and is further disposed in the at least one via hole and contacting the first semiconductor layer.

7. The light-emitting device of claim 1, wherein the at least one first electrode includes a plurality of first electrodes spaced apart from each other, and the at least one second electrode includes a plurality of second electrodes spaced apart from each other.

8. A display apparatus comprising:

an array substrate including a thin-film transistor, a first pad electrode electrically connected to the thin-film transistor, and a second pad electrode spaced apart from the first pad electrode;

an adhesive layer disposed on the first pad electrode and the second pad electrode; and a light-emitting device disposed on the adhesive layer, wherein the light-emitting device includes:

a light-emitting structure including a first semiconductor layer, an active layer and a second semiconductor layer;

a passivation layer covering surfaces of the light-emitting structure;

at least one first electrode electrically connected to the first semiconductor layer; and at least one second electrode electrically connected to the second semiconductor layer, wherein the at least one first electrode includes:

a first upper portion extending through the passivation layer and contacting the first semiconductor layer;

a first side portion disposed on a portion of a side surface of the light-emitting structure; and a first lower portion disposed on a portion of a lower surface of the light-emitting structure, wherein the at least one second electrode includes:

a second upper portion extending through the passivation layer and contacting the second semiconductor layer;

a second side portion disposed on a portion of the side surface of the light-emitting structure; and a second lower portion disposed on a portion of the lower surface of the light-emitting structure.

9. The display apparatus of claim 8, wherein each of the active layer and the second semiconductor layer is partially disposed on the first semiconductor layer.

10. The display apparatus of claim 9, wherein the first upper portion of the at least one first electrode is disposed on a portion of an upper surface of the first semiconductor layer, and wherein the first side portion of the at least one first electrode is disposed on a portion of a side surface of the first semiconductor layer.

11. The display apparatus of claim 9, wherein a thickness of the first upper portion of the at least one first electrode is larger than a thickness of the first lower portion of the at least one first electrode.

12. The display apparatus of claim 8, wherein the light-emitting structure has at least one via hole extending through the second semiconductor layer and the active layer and exposing a portion of the first semiconductor layer.

13. The display apparatus of claim 12, wherein the first upper portion of the at least one first electrode is disposed on a portion of an upper surface of the second semiconductor layer and is further disposed in the at least one via hole and contacting the first semiconductor layer.

14. The display apparatus of claim 8, wherein the at least one first electrode includes a plurality of first electrodes spaced apart from each other, and the at least one second electrode includes a plurality of second electrodes spaced apart from each other.

15. The display apparatus of claim 8, wherein the display apparatus further comprises:

a first connection electrode contacting at least the first lower portion or the first upper portion of the first electrode and extending through the adhesive layer and contacting the first pad electrode; and a second connection electrode contacting at least the second lower portion or the second upper portion of the second electrode and extending through the adhesive layer and contacting the second pad electrode.

16. The display apparatus of claim 8, wherein the display apparatus further comprises:

a first conductive adhesive layer disposed between the first electrode of the light-emitting device and the first pad electrode; and a second conductive adhesive layer disposed between the second electrode of the light-emitting device and the second pad electrode.

17. The display apparatus of claim 8, wherein the display apparatus further comprises:

a first connection electrode contacting at least the first lower portion of the first electrode and extending through the adhesive layer and contacting the first pad electrode; and a conductive adhesive layer disposed between the second electrode and the second pad electrode.

18. The display apparatus of claim 8, wherein the display apparatus further comprises:

a first connection electrode contacting at least the first upper portion of the first electrode and extending through the adhesive layer and contacting the first pad electrode; and a conductive adhesive layer disposed between the second electrode and the second pad electrode.

19. The display apparatus of claim 8, wherein the display apparatus further comprises a black matrix disposed around the light-emitting device.

* * * * *